(12) United States Patent
Wang et al.

(10) Patent No.: US 7,961,383 B2
(45) Date of Patent: Jun. 14, 2011

(54) ENGINEERED FLUORIDE-COATED ELEMENTS FOR LASER SYSTEMS

(75) Inventors: Jue Wang, Fairport, NY (US); Horst Schreiber, Rochester, NY (US)

(73) Assignee: Corning Incorporated, Corning, NY (US)

( * ) Notice: Subject to any disclaimer, the term of this patent is extended or adjusted under 35 U.S.C. 154(b) by 231 days.

(21) Appl. No.: 12/072,427

(22) Filed: Feb. 26, 2008

(65) Prior Publication Data
US 2008/0204862 A1    Aug. 28, 2008

Related U.S. Application Data

(60) Provisional application No. 60/904,132, filed on Feb. 28, 2007.

(51) Int. Cl.
*F21V 9/04* (2006.01)
*G02B 1/10* (2006.01)

(52) U.S. Cl. .......... 359/359; 359/360; 359/586; 359/587

(58) Field of Classification Search .......... 359/350–361, 359/577–590
See application file for complete search history.

(56) References Cited

U.S. PATENT DOCUMENTS

| | | | |
|---|---|---|---|
| 4,693,933 A * | 9/1987 | Keem et al. | 428/333 |
| 6,441,963 B2 * | 8/2002 | Murakami et al. | 359/584 |
| 6,809,876 B2 | 10/2004 | Taki | |
| 7,193,228 B2 * | 3/2007 | Bowering et al. | 250/504 R |
| 7,261,957 B2 * | 8/2007 | Bijkerk et al. | 428/701 |
| 2005/0225737 A1 * | 10/2005 | Weissenrieder et al. | 355/53 |
| 2006/0066940 A1 * | 3/2006 | Trenkler et al. | 359/359 |
| 2006/0262389 A1 * | 11/2006 | Zaczek | 359/359 |

FOREIGN PATENT DOCUMENTS
JP    2001194526    7/2001

OTHER PUBLICATIONS

Y. Taki et al.; "Hetero-epitaxial growth and optical properties of LaF3 on CaF2"; Thin Solid Films 420-421 (2002) 30-37.
J. Wang et al.; "Nano-structure of GdF3 thin film evaluated by variable angle spectroscopic ellipsometry"; Proc. of SPIE vol. 6321 (2006) 632107-1-632107-10.
R. Theilsch et al.; "Optical, structural, and mechanical properties of gadolinium tri-fluoride thin films grown on amorphous substrates"; Proc. of SPIE vol. 5963 (2005) 59630O-1-59630O-12.

(Continued)

*Primary Examiner* — Thong Nguyen
(74) *Attorney, Agent, or Firm* — Walter M. Douglas (57) ABSTRACT

The invention is directed to elements having fluoride coated surfaces having multiple layers of fluoride material coatings for use in laser systems, and in particular in laser systems operating at wavelength <200 nm. In a particular embodiment the invention is directed to highly reflective mirrors for use in wavelengths <200 nm laser systems. The invention describes the mirrors and a method of making them that utilizes a plurality of periods of fluoride coatings, each period comprising one layer a high refractive index fluoride material and one layer low refractive index fluoride material, and additionally at least one layer of an amorphous silica material. The silica material can be inserted between each period, inserted between a stack consisting of a plurality of periods, and, optionally, can also be applied as the final layer of the finished element to protect the element.

23 Claims, 8 Drawing Sheets

OTHER PUBLICATIONS

R. Thielsch et al.; "Development of mechanical stress in fluoride multi-layers for UV—applications"; Proc. of SPIE vol. 5250 Advances in Optical Thin Films, p. 127-136.

C. Lee et al.; "Characterization of AlF3 thin films at 193nm by thermal evaporation"; Applied Optics (2005) vol. 44, No. 34, p. 7333-7338.

D. Ristau et al.; "Ultraviolet optical and microstructural properties of MgF2 and LaF3 coatings deposited by ion-beam sputtering and boat and electron-beam evaporation"; Applied Optics, (2002) vol. 41, No. 16 pp. 3196-3204.

Schroder et al; "Nanostructure and Optical properties of fluoride films for high-quality DUV/VUV optical components"; Proc. of SPIE, vol. 5963 p. 59630R-1-59630R-10.

Liu et al.; "Microstructure-related properties at 193nm of MgF2 and GdF3 films deposited by a resistive-heating boat"; Applied Optics/ vol. 45, No. 7; Mar. 1, 2006; p. 1368-1374.

* cited by examiner

ENGINEERED FLUORIDE-COATED ELEMENTS FOR LASER SYSTEMS

CROSS-REFERENCE TO RELATED APPLICATIONS

This application claims the benefit of priority under 35 U.S.C. §119(e) of U.S. Provisional Application Ser. No. 60/904,132 filed on Feb. 28, 2007, the content of which is relied upon and incorporated herein by reference in its entirety.

FIELD

The invention is directed to fluoride coated surfaces and elements having multiple layers of fluoride material coatings for use in laser systems. In particular, the invention is directed to surfaces, for example, highly reflective mirrors for use with 193 nm lasers that have multiple layers of coatings of fluoride materials.

BACKGROUND

ArF excimer lasers are the illumination sources of choice for the microlithographic industry. The industry constantly demands more performance from excimer laser sources. As a result, greater demands are constantly placed on excimer laser optical components, for example, the highly reflective mirrors that are used in 193 nm wavelength excimer lasers that operate at high repetition rates. These highly reflective mirrors are typically made using at least one high refractive index material and one low refractive index material. Among the very limited number of materials that can be used for such mirrors, $GdF_3$ and $LaF_3$ are considered as high refractive index materials and $MgF_2$ and $AlF_3$ are the low refractive index materials that are used for wavelengths below 200 nm. [see D. Ristau et al., "Ultraviolet optical and microstructural properties of $MgF_2$ and $LaF_3$ coating deposited by ion-beam sputtering and boat and electron-beam evaporation", *Applied Optics* 41, 3196-3204 (2002); R. Thielsch et al., "Development of mechanical stress in fluoride multi-layers for UV-applications", Proc. *SPIE* 5250, 127-136 (2004); C. C. Lee et al., "Characterization of $AlF_3$ thin films at 193 nm by thermal evaporation", *Applied Optics* 44, 7333-7338 (2005); R. Thielsch et al, "Optical, structural and mechanical properties of gadolinium tri-fluoride thin films grown on amorphous substrates", Proc. *SPIE* 5963, 5963001-12 (2005); and Jue Wang and Robert L. Maier, "Nano-structure of $GdF_3$ thin film evaluated by variable angle spectroscopic ellipsometry", Proc. *SPIE* 6321, p6321071-10(2006)]. At the present time there is renewed research interest in wide band-gap fluoride thin films for ArF laser optics applications. The application of energetic deposition processes, such as plasma ion-assisted deposition (PIAD), ion assisted deposition (IAD) and ion beam sputtering (IBS), are restricted for fluoride materials because of the nature of fluoride materials. As a result, the industry has accepted thermal resistance evaporation for fluoride film deposition without introducing fluorine depletion. However, when thermal resistance evaporation is used as the film deposition method, the resulting fluoride film packing density is low (that is, it is porous) and the film structure is inhomogeneous. Neither of these is desirable because a porous structure can harbor environmental contamination and increases scatter losses. Various approaches have been applied to improve fluoride film structure including substrate temperature and deposition rate. Recently, the effect of substrate crystal orientation has also been taken into account, but no significant improvements have been reported. [see Y. Taki and K. Muramatsu, "Hetero-epitaxial growth and optical properties of $LaF_3$ on $CaF_2$", Thin Solid Films 420-421, 30-37 (2002), and U.S. Pat. No. 6,809,876 to Y. Taki et al., titled "OPTICAL ELEMENT EQUIPPED WITH LANTHANUM FLUORIDE FILM"].

Another problem arises from the fact that many periods of high index and low index layers (one period equals one high and one low refractive index layer) are required in order to get high reflectivity at 193 nm. However, the surface/interface roughness and inhomogeneity increase as number of layers and the overall thickness increases. The control of the multi-layer fluoride film structure is critical for achieving high reflectivity at 193 nm. In addition to their use in microlithography, fluoride coated mirrors are also required for those areas where ArF excimer laser have other, non-lithographic application, for example minimal invasive brain-, vascular- and eye surgery; ultra-precision machining & measurement; large-scale integrated electronic devices; and components for communication. In view of the problems extant with the present fluoride coated elements, for example mirrors, that are used in below 200 nm, and particularly in 193 nm, lithography, it is desirable to have fluoride coated elements that overcome these problems. In addition to mirrors, the invention can also be applied to beamsplitters, prisms, lenses, output couplers and similar elements used in <200 nm laser systems.

SUMMARY

The invention is directed to elements for use in <200 nm laser systems, the element comprising a substrate; one or a plurality of periods of fluoride coating materials, each of said periods comprising at least one layer of a high refractive index fluoride material and at least one layer of a low refractive fluoride material; and at least one layer of an amorphous $SiO_2$ material selected from the group consisting of amorphous silica, amorphous F-doped $SiO_2$, amorphous $Al_2O_3$-doped $SiO_2$, and amorphous N-doped $SiO_2$. In accordance with the invention the amorphous $SiO_2$ material can be inserted after each period of the fluoride coating material or after a stack consisting of a plurality of periods of fluoride coating material. Optionally, a layer of the amorphous $SiO_2$ material can be applied to the substrate prior to the application of the first period of fluoride coating materials. The fluoride coating materials are metal fluoride materials having a high refractive index and low refractive index, and these materials are applied in alternating layers to the substrate or amorphous $SiO_2$ coated substrate. In some embodiments the high refractive index fluoride material has an index in the range of 1.65 to 1.75 and said low refractive fluoride material has an index in the range of 1.35 to 1.45. Substrates that can be used for the elements are glass and glass-ceramic substrates; alkaline metal fluoride single crystal substrates; metallic substrates, for example without limitation, substrates made from aluminum, titanium, and other metals known in the art that are know to be resistant to deterioration in a 200 nm laser environment such as found in ArF and $F_2$ lasers; and other materials resistant to deterioration in a 200 nm laser environment such as found in ArF and $F_2$ lasers, for example silicon nitride ($Si_3N_4$). The amorphous $SiO_2$ material includes amorphous $SiO_2$ itself and doped amorphous $SiO_2$ materials such as silica materials doped with fluorine (F), silica materials doped with $Al_2O_3$, and silica materials doped with nitrogen (N), fluoride (F) and $Al_2O_3$. Each period of fluoride coating has a thickness in the range of 50 nm to 90 nm, and within the period the high refractive index material has a coating in the range of 20 nm to 40 nm, and the low refractive index material has a thickness in the range of 30 nm to 50 nm. The $SiO_2$ layer applied to the substrate before coating (optional), or after a period or stack or periods, has a thickness in the range of 5 nm to 75 nm. The final layer of $SiO_2$ applied to element after the deposition of all the fluoride coating periods has a thickness in the range of 10 nm to 150 nm.

The invention is further directed to a method for preparing fluoride coated elements and in particular highly reflective fluoride coated mirrors for use in <200 nm laser systems. The method has at least the steps of providing a substrate; coating the substrate with one or a plurality of periods of fluoride coating materials using an energetic deposition technique, each such period having at least one layer of a high refractive index fluoride material and at least one layer of a low refractive index fluoride coating material; and further coating using an amorphous $SiO_2$ material including amorphous $SiO_2$ material itself and doped amorphous $SiO_2$ materials. In one embodiment of the method the $SiO_2$ is applied as a layer after each fluoride coating period. In another embodiment of the method the $SiO_2$ layer is applied after a stack of a plurality of fluoride coating material periods. In another embodiment of the method a $SiO_2$ layer is applied to the substrate prior to the applying the first period of fluoride coating materials. Energetic deposition techniques that can be used in practicing the invention include PIAD (plasma ion-assisted deposition), IAD (ion-assisted deposition), and IBS (ion beam sputtering).

DETAILED DESCRIPTION

As used herein, the terms "fluoride coated mirrors" and "fluoride mirrors" include mirrors in which the fluoride coating is applied to substrates such as alkaline earth metal fluoride single crystal materials (single crystals of $CaF_2$, $BaF_2$, $SrF_2$, $BaF_2$), glass materials (for example $SiO_2$, HPSF® (Corning Incorporated), BK7™ M and SF10™(Schott Glass)), metallic materials (for example, aluminum, titanium) and other materials (for example, Si, $Si_3N_4$). Also as used herein, the term "period" as applied to fluoride coatings means one high refractive index layer and one low refractive index layer. The term "stack" as used herein means two or more periods of fluoride materials coated on the substrate which lie between the substrate and the $SiO_2$ films of the invention or between two $SiO_2$ films.

In wavelengths <200 nm laser systems, for example, ArF laser systems which operate at 193 nm, scatter and contamination are the main factors that degrade the performance of fluoride mirrors and fluoride enhanced mirrors. Fluorine depletion generates significant absorption at 193 nm if advanced energetic deposition processes are used to improve fluoride film structure and reduce scatter loss. Among the problems associated with standard fluoride mirrors, including fluoride-enhanced-oxide mirrors and fluoride-enhanced-Al mirrors are:

(1) it is difficult to obtain a reflectivity over 97% at 193 nm,
(2) the reflectivity is environmental sensitive,
(3) the porous structure of fluoride films harbors contamination, leading to absorption at 193 nm, and
(4) laser durability is low The present invention overcomes these problems by insertion of amorphous silica ($SiO_2$) layers between a period or stack of periods of the high and low refractive index materials that are use to coat the mirror blanks (substrates). In general, the invention is directed to using a PIAD smoothed $SiO_2$ layer is periodically inserted into fluoride stacks and also use $SiO_2$ as the top, capping or final layer. More specifically, the invention relates to:

(1) inserting amorphous $SiO_2$ layer to eliminate the growth of inhomogeneous fluoride film structure,
(2) using PIAD to smooth the amorphous $SiO_2$ layer surface,
(3) continuously growing fluoride films on the smoothed $SiO_2$ surface, and
(4) using the dense smoothed $SiO_2$ as capping layer to reduce the fluoride exposed surface area by a factor of $\sim 10^{-5}$ and thus to seal the engineered fluoride mirror.

[1]. The Surface Roughness of a Fluoride Single Layer

Figure 1:
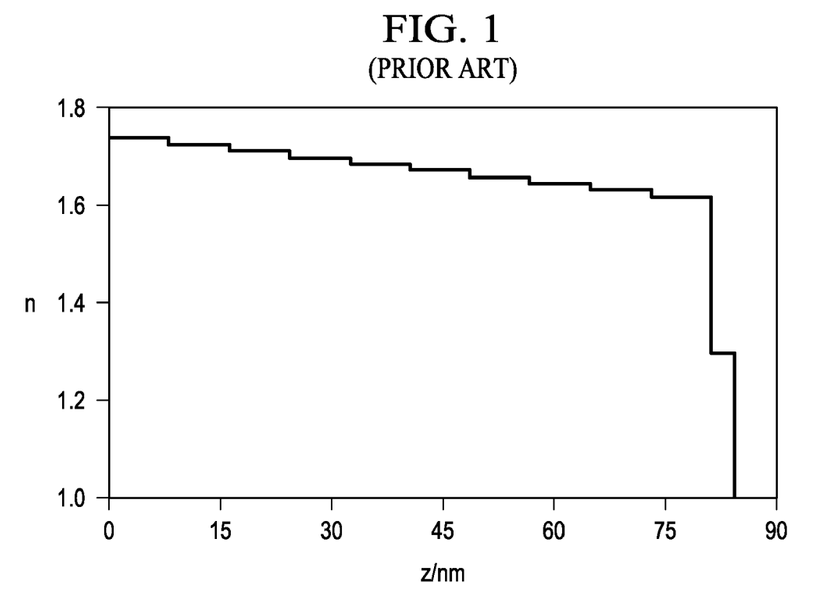
FIG. 1 (Prior Art) is a graph illustrating the refractive index depth profile of a $GdF_3$ film grown on $CaF_2$ (111).

Standard fluoride mirrors comprise multiple layers of fluoride materials; in particular, alternating layers of a high refractive index material and a low refractive index material. The fluoride film growth mechanism was investigated using a $GdF_3$ single layer as an example, and the results indicate that the layer has an inhomogeneous structure and a rough surface. FIG. 1 (Prior Art) shows the refractive index (at 193 nm) depth profile of a $GdF_3$ film grown on $CaF_2$ (111) surface. The refractive index is proportional to film packing density. In general for the $GdF_3$ film, high refractive index originates from a dense film, whereas low refractive index corresponds to a porous film structure. As can be seen in FIG. 1, at the beginning of the $GdF_3$ film formation a dense thin layer is formed on the substrate leading to a refractive index of 1.738. As the film thickness increases, the growth mechanisms of columnar and polycrystalline microstructure may introduce gaps between crystal grains. As a consequence, the film density decreases as the layer thickness accumulates. At the end of film growth the refractive index has further dropped to 1.62, corresponding to a mean porosity of 15.8%. A refractive index of 1.35 represents a 3.5 nm surface roughness layer in FIG. 1. High refractive index fluoride materials have an index of refraction n in the range of 1.65 to 1.75, and low refractive index fluoride material has an index on the range of 1.35 to 1.45.

Figure 2A:
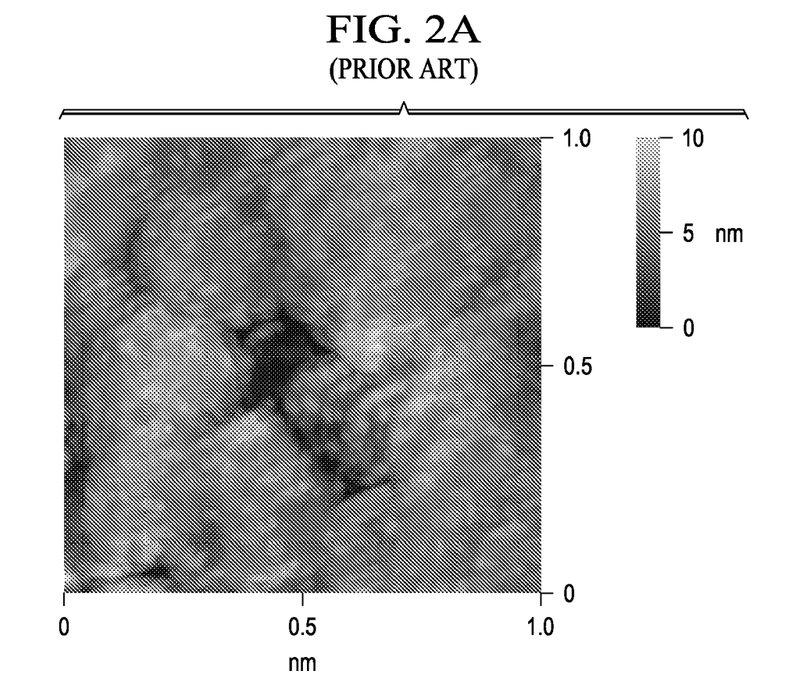
FIGS. 2A and 2B (Prior Art) are AFM images of $GdF_3$ single layer grown on a $CaF_2$ (111) single crystal.
Figure 2B:
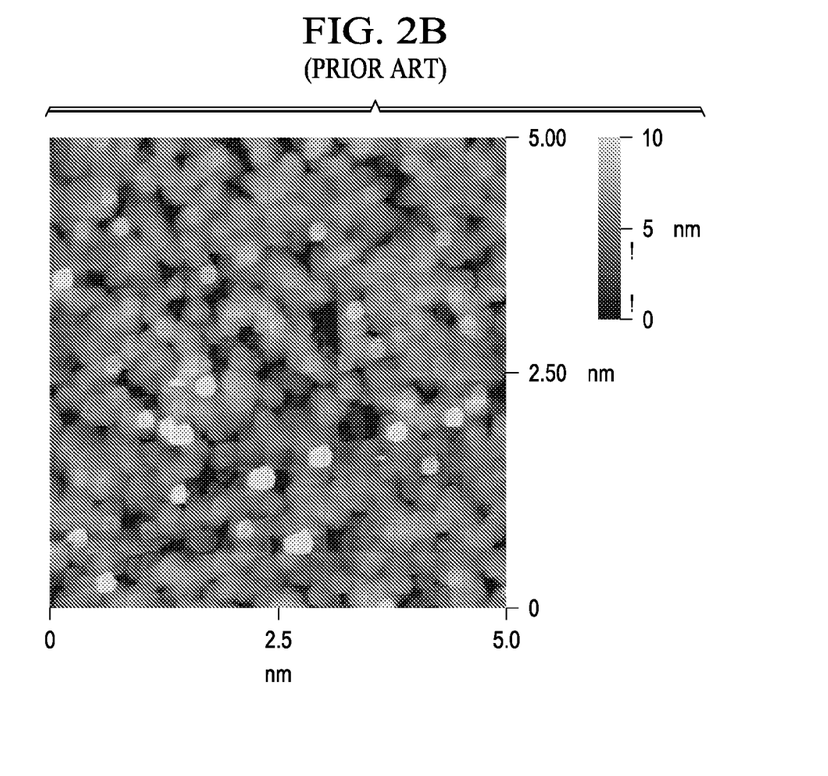

FIGS. 2A and 2B (Prior Art) exhibits AFM (atomic force microscopy) images over 1μ×1μ and 5μ×5μ scanning areas of the $GdF_3$ layer, respectively. The grain and the pore sizes shown in FIGS. 2A and 2B range from 300 nm to 350 nm. The AFM images clearly reveal the nano-porous morphology of GdF₃ film growth on a CaF₂ (111) surface. As can be seen in the 1μ×1μ image of FIG. 2A, there are some gaps between the accumulated dense grains, leading to the formation of porous structure. By increasing AFM scanning size to 5μ×5μ as shown in FIG. 2B, the porous network is obvious on the film growth plane. As predicted by ellipsometric modeling, the inhomogeneity of the GdF₃ film is a result of film porosity changes during growth. The randomly distributed porous structure with relatively high internal surface area may connect to each other to some degree and may harbor environmental contamination.

Figure 3:
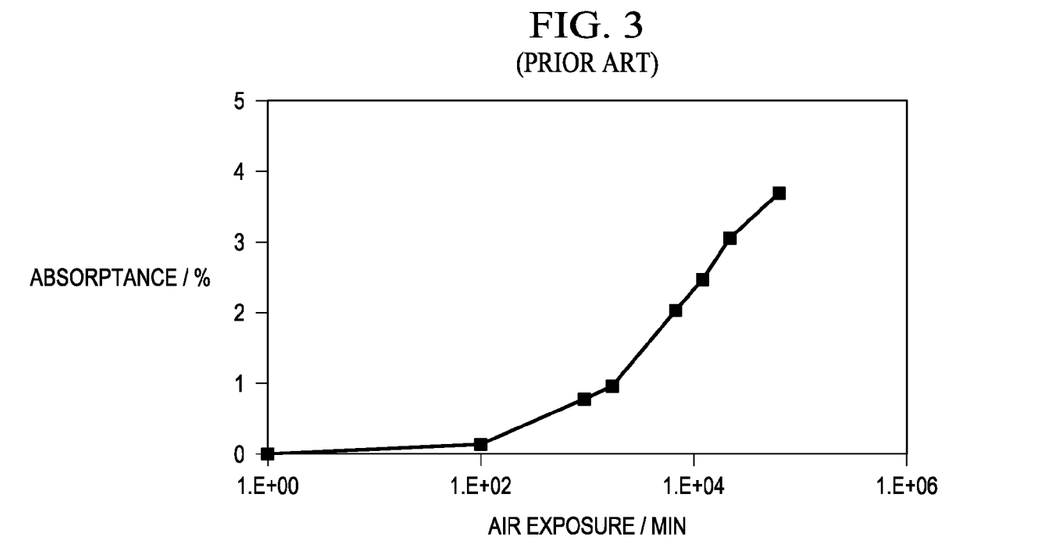
FIG. 3 (Prior Art) is a graph illustrating the absorbance of a $GdF_3$ film at 193 nm as a function of air exposure time.

FIG. 3 (Prior Art) shows the absorbance of the GdF₃ film at 193 nm as a function of laboratory ambient exposure (air exposure). The film absorbance increases over exposure time to air. In summary, fluoride films are inhomogeneous and porous in general. As layer thickness increases, film surface roughness increases. The porous film structure and rough surface lead to high absorption and scatter loss at 193 nm wavelength.

[2]. Surface and Interface of Standard Fluoride Mirror

Figure 4:
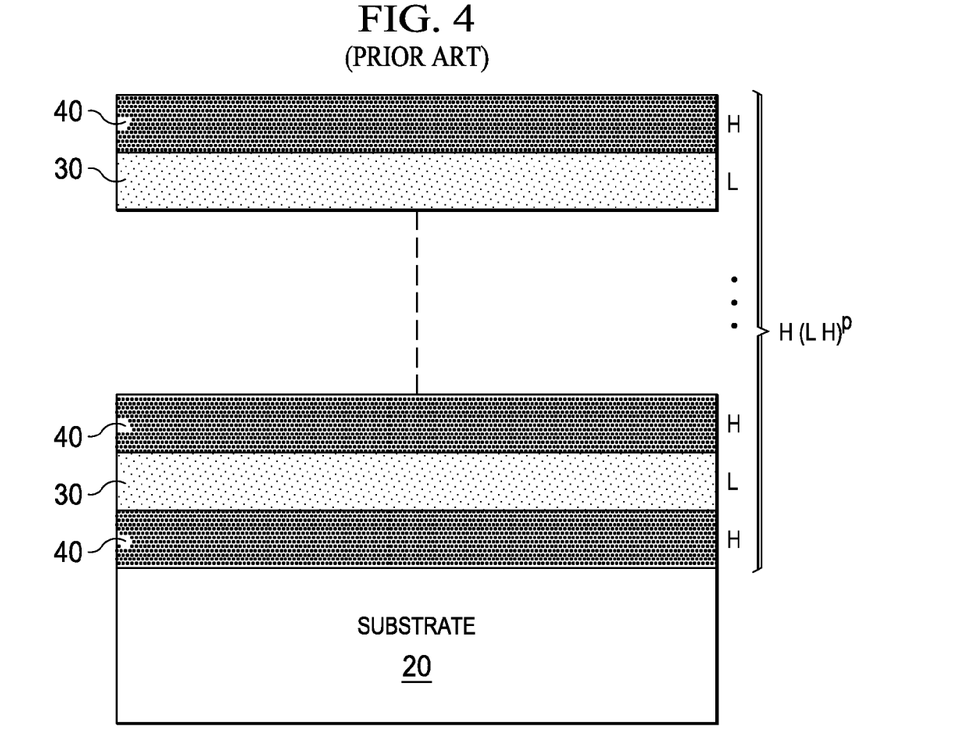
FIG. 4 (Prior Art) is a schematic diagram illustrating of a standard fluoride mirror having high and low refractive index materials coated on a substrate.

Based on our experimental results, the surface roughness of standard fluoride mirror, $R_m$, can be described by Equation (1), $$R_m = \alpha p + \beta R_s \qquad (1)$$

where $\alpha$ and $\beta$ are fluoride material and deposition process related parameters, Rs is the surface roughness of the substrate, and p is the stack period. A stack period is defined as a combination of low refractive index and high refractive index layers. Parameter $\alpha$ is related to the high and the low refractive fluoride layers used for the period such as GdF₃/MgF₂, LaF₃/MgF₂, GdF₃/AlF₃ and LaF₃/AlF₃, the deposition rate and substrate temperature for each material. Parameter $\beta$ is dominated by the substrate material properties and surface finishing condition. Using standard fluoride mirrors, for example, at a normal angle of incidence, i.e., 0°, the fluoride mirrors compromise stacks of high and low refractive index layers as represented by Formula (2):

$$\text{Sub\_H(LH)}^p \qquad (2)$$

where H and L corresponds to a quarter-wave high index GdF₃ and a quarter-wave low index AlF₃, respectively, and p is a stack period. A schematic of the mirror is shown in FIG. 4 (Prior Art). [Note: In all the figures, the substrate is numbered as 20; L is numbered as 30; H is numbered as 40, the SiO₂ layer 2M is numbered as 50.]

Figure 5:
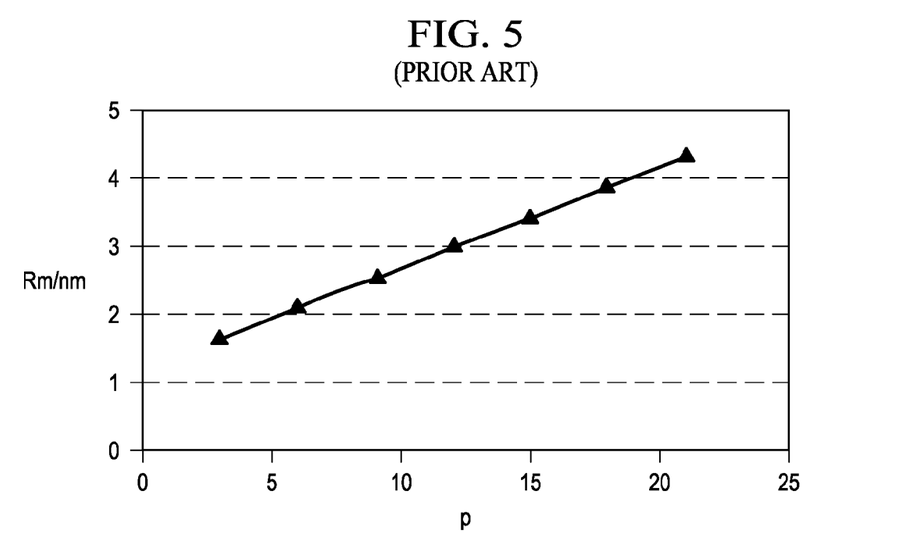
FIG. 5 (Prior Art) is a graph illustrating the surface roughness of standard fluoride mirrors as a function of stack period.
Figure 6:
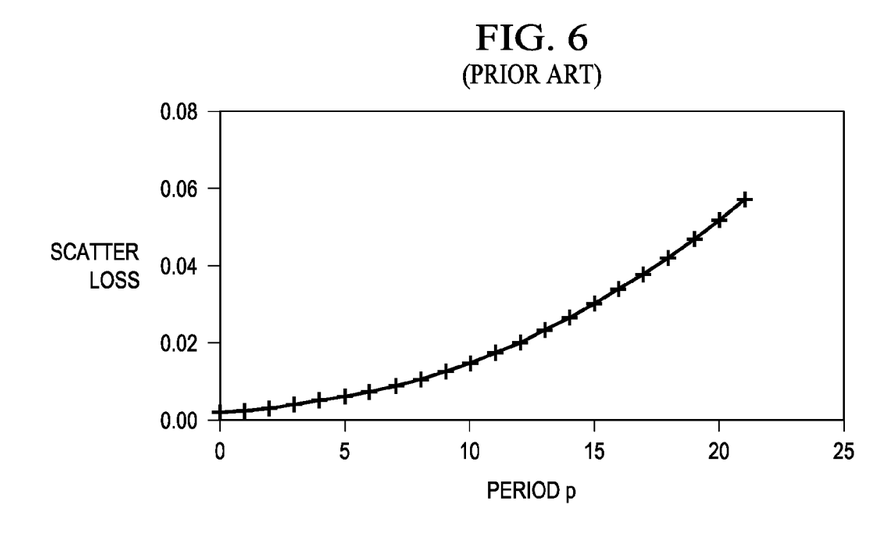
FIG. 6 (Prior Art) is a graph illustrating the scatter loss of standard fluoride mirrors as a function of stack period.

FIG. 5 (Prior Art) is a graph showing the surface roughness of standard fluoride mirrors as a function of stack period. The surface roughness is linearly proportional to the stack period as described in formula (1). That is, the more periods a standard mirror contains the rougher the surface becomes. FIG. 6 (Prior Art) shows surface and interfacial scatter loss of fluoride mirrors as a function of stack period. Generally, a large number of stack periods (p>16) are required in order to achieve high reflectivity in the final mirror product. As can be seen from FIG. 6, scatter loss increases slowly when the stack period is a small number. However, FIG. 6 shows that the slope of the curve increases along with an increasing number of stack periods. In other words, scatter loss increases faster than the additional reflectivity gain due to adding more stack periods into standard fluoride mirror. As a result, there is an optimized number of stack periods which offers the highest reflectivity when one takes into account of scatter loss.

Figure 7:
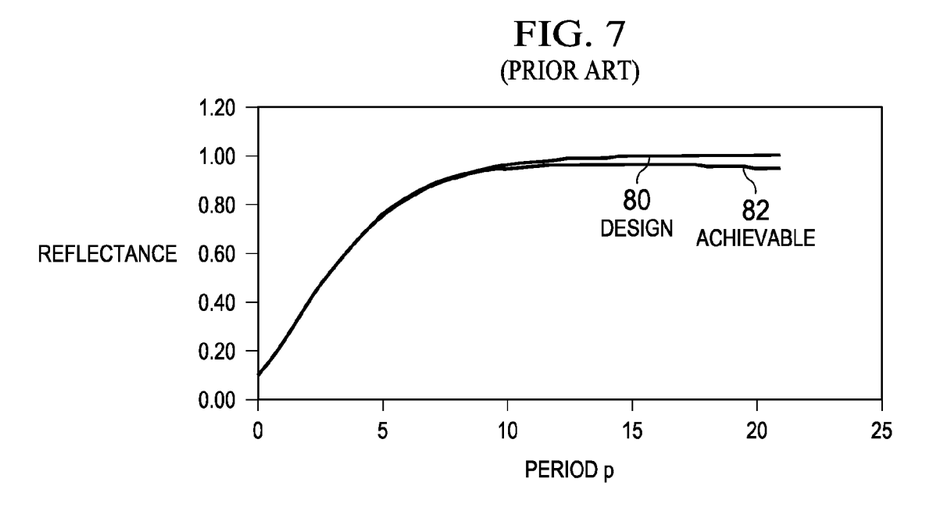
FIG. 7 (Prior Art) is a graph illustrating the reflectance of standard fluoride mirrors as a function of stack period.

FIG. 7 (Prior Art) shows reflectance of standard fluoride mirror as a function of stack period. According to the design calculations (design curve is numeral 80), the reflectance as a function of stack period can be separated into 3 zones which are:

1. a fast increasing region (up to 6 periods),
2. a slow increasing region (more than 16 periods) and
3. transition region from the fast increase to the slow increase.

The achievable reflectance (numeral 82), which also has 3 zones, is plotted in the same figure for comparison. The fast increasing region of the achievable reflectance is almost the same as that of the design reflectance. The transition zone for the achievable reflectance is very similar to the design, but there is a small separation when the stack period number is located at the high end of the zone. The main difference between the achievable reflectance and the design reflectance is located in the region where the period number is greater than 16. Instead of a slow increase of reflectance as shown for the design reflectance, a slow decrease of reflectance appears in the high period region for the achievable reflectance because of scatter loss. Consequently, in order to successfully make a high reflectance fluoride mirror it is necessary to eliminate surface and interface roughness. As discussed above, energetic deposition techniques cannot be used to make dense smooth fluoride films without generating fluorine depletion. The invention describes high reflectance fluoride mirrors which utilize SiO₂ based oxide layers to smooth-out fluoride films to achieve high reflectivity.

[3]. Smoothed Amorphous SiO₂ by Energetic Deposition

Figure 8A:
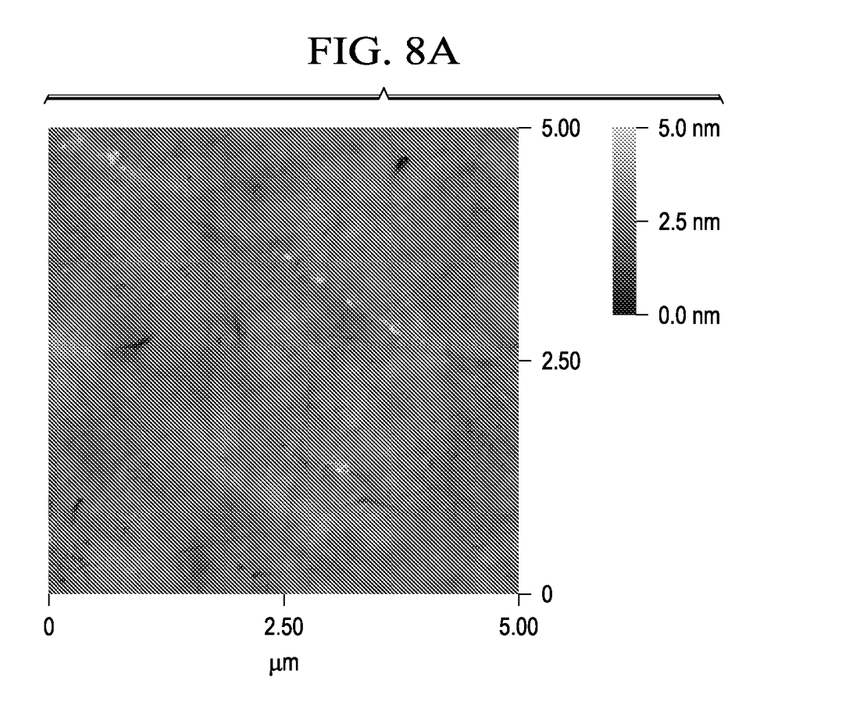
FIGS. 8A and 8B are AFM images comparing the PIAD smoothed $SiO_2$ film of FIG. 8A with the uncoated $SiO_2$ substrate of 8B.
Figure 8B:
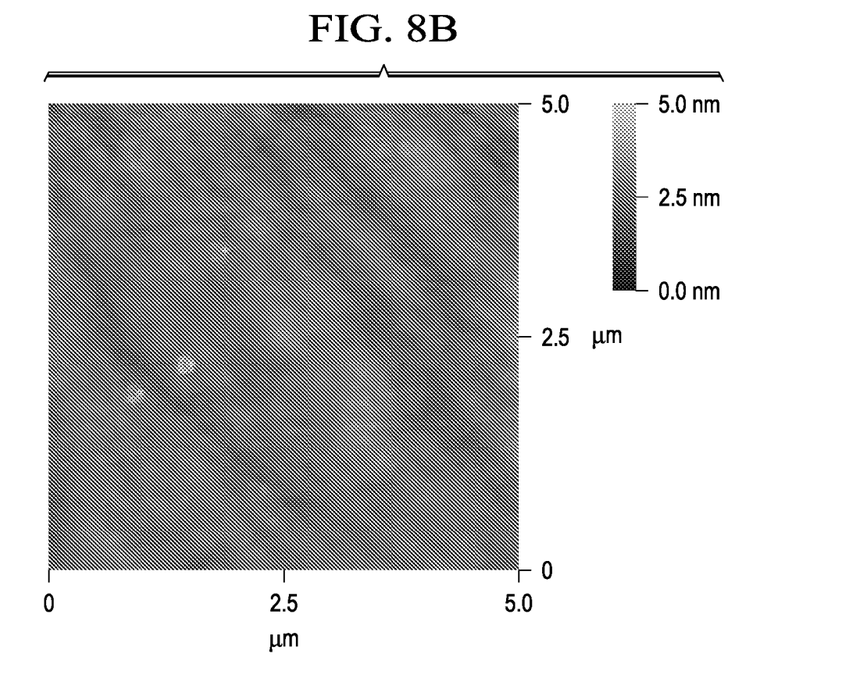

In accordance with the invention, an amorphous but dense and smooth, SiO₂ film is inserted into a fluoride stack by means of energetic deposition. Dense smooth SiO₂ films can be deposited by PIAD, LAD and IBS. Here PIAD deposited SiO₂ is used as an example. FIG. 8A is an AFM image of PIAD smoothed SiO₂ film on a SiO₂ substrate. The surface roughness of the uncoated substrate is 0.35 nm. After depositing a 200 nm SiO₂ film, the surface roughness has been reduced to 0.29 nm. The result shows that the smoothed SiO₂ film reduces roughness of an uncoated substrate. FIG. 8B illustrates how a SiO₂ film can be also used to improve, that is, decrease, the surface smoothness of a coated substrate. In accordance with the invention, at least one PIAD deposited SiO₂ layer has been inserted into standard fluoride mirror to protect fluoride films from plasma ion direct bombardment, and to smooth out the fluoride film's accumulated rough structure. Fluoride stacks can be continuously deposited on the smoothed SiO₂ film layer. In preferred embodiments the final layer is a SiO₂ film layer. In FIG. 8B, the surface roughness is 0.29 nm after application of the SiO₂ film. Before application of the SiO₂ film the surface roughness was 0.35 nm.

[4]. Surface and Interface Engineered Fluoride Mirror

Figure 9:
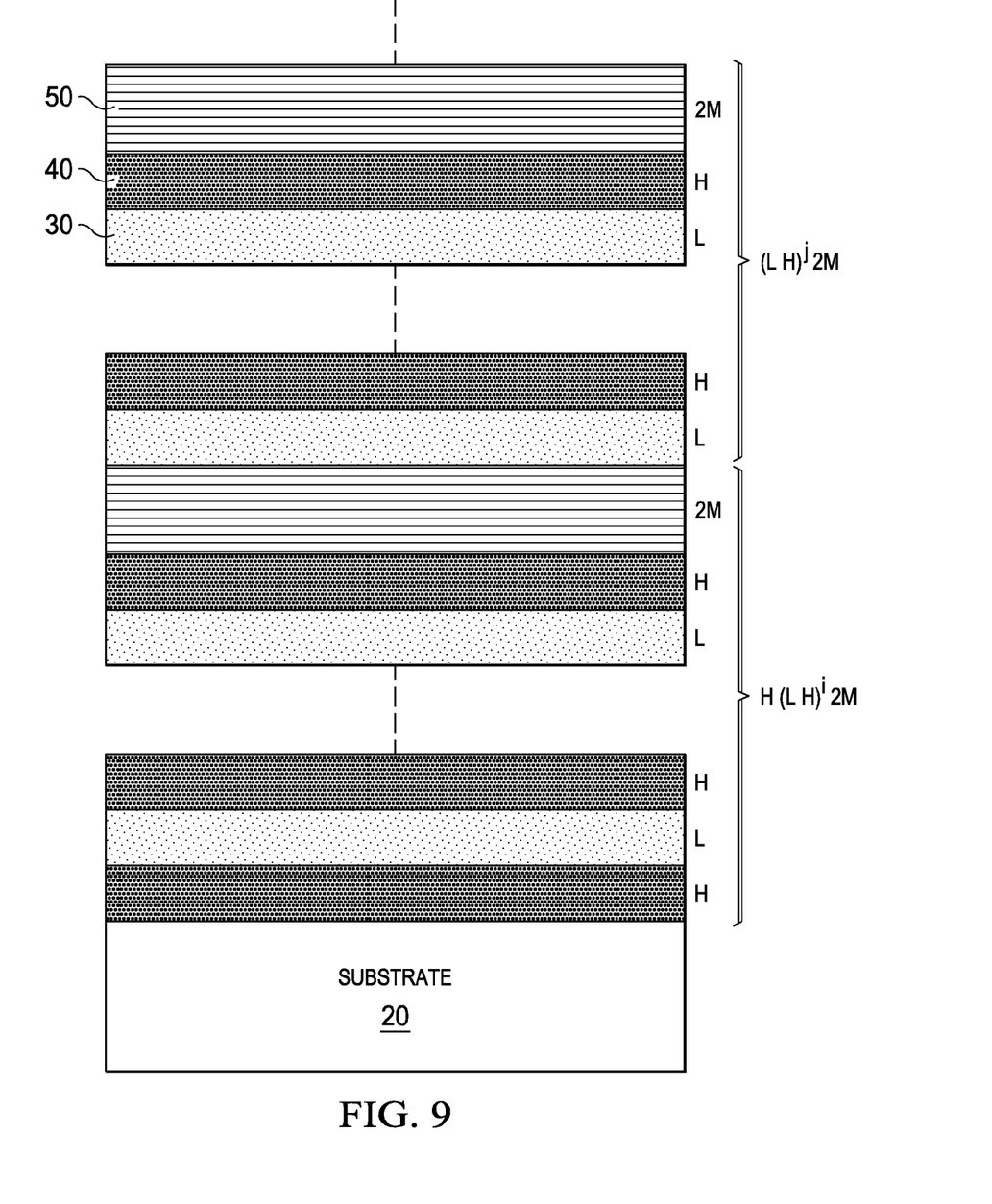
FIG. 9 is a schematic diagram illustrating the surface and interface of an engineered fluoride mirror.

Surface and interface engineered fluoride mirrors can be described by Formula (3):

$$\text{Sub\_H(LH)}^i 2M(LH)^j 2M \ldots (LH)^k 2M \qquad (3)$$

where 2M represents a half-wave SiO₂ layer; H and L are high index and low index fluoride layers, respectively; and i, j . . . and k are stack periods. According to Equation (3), a SiO₂ layer is inserted into standard fluoride mirror every i, j . . . k stack periods. FIG. 9 shows a schematic of surface and interfacial engineered fluoride mirror as represented by Formula (3). Table 1 lists a comparison of standard and surface/interface engineered fluoride mirrors with a stack period of 21, where 3 nm surface and interface roughness is used for the engineered mirror.

TABLE 1

Comparison of standard and surface/interface engineered mirrors

|  | Standard mirror | Engineered mirror |
|---|---|---|
| Scatter loss (%) | 5.69 | 1.16 |
| Reflectance design (%) | 99.96 | 99.57 |
| Reflectance achievable (%) | 94.27 | 98.41 |

Although the designed reflectance of the standard mirror (99.96%) is higher than the engineered mirror (99.57%), the scatter loss of the standard mirror is 4.9 times greater than that of the engineered mirror. The final achievable reflectance is 94.27% and 98.41% for the standard and the engineered mirrors, respectively. In some embodiments of the invention the top layer of the engineered mirror ends with a dense $SiO_2$ layer as shown in formula (3). This top layer of $SiO_2$ seals and smoothes the porous structure as is shown in the AFM images of FIGS. 8A and 8B. In addition, as a result of applying a dense $SiO_2$ film as described herein, the risk for environmental contamination penetrating into the porous fluoride structure is eliminated. This is a further difference between the surface/interface engineered mirrors of the invention as compared to the standard fluoride mirror which can easily be contaminated due to porosity as is illustrated by $GdF_3$ single layer data shown in FIG. 3 (Prior Art).

[5]. Surface/Interface Engineered Fluoride-Enhanced-Oxide Mirror

Figure 10:
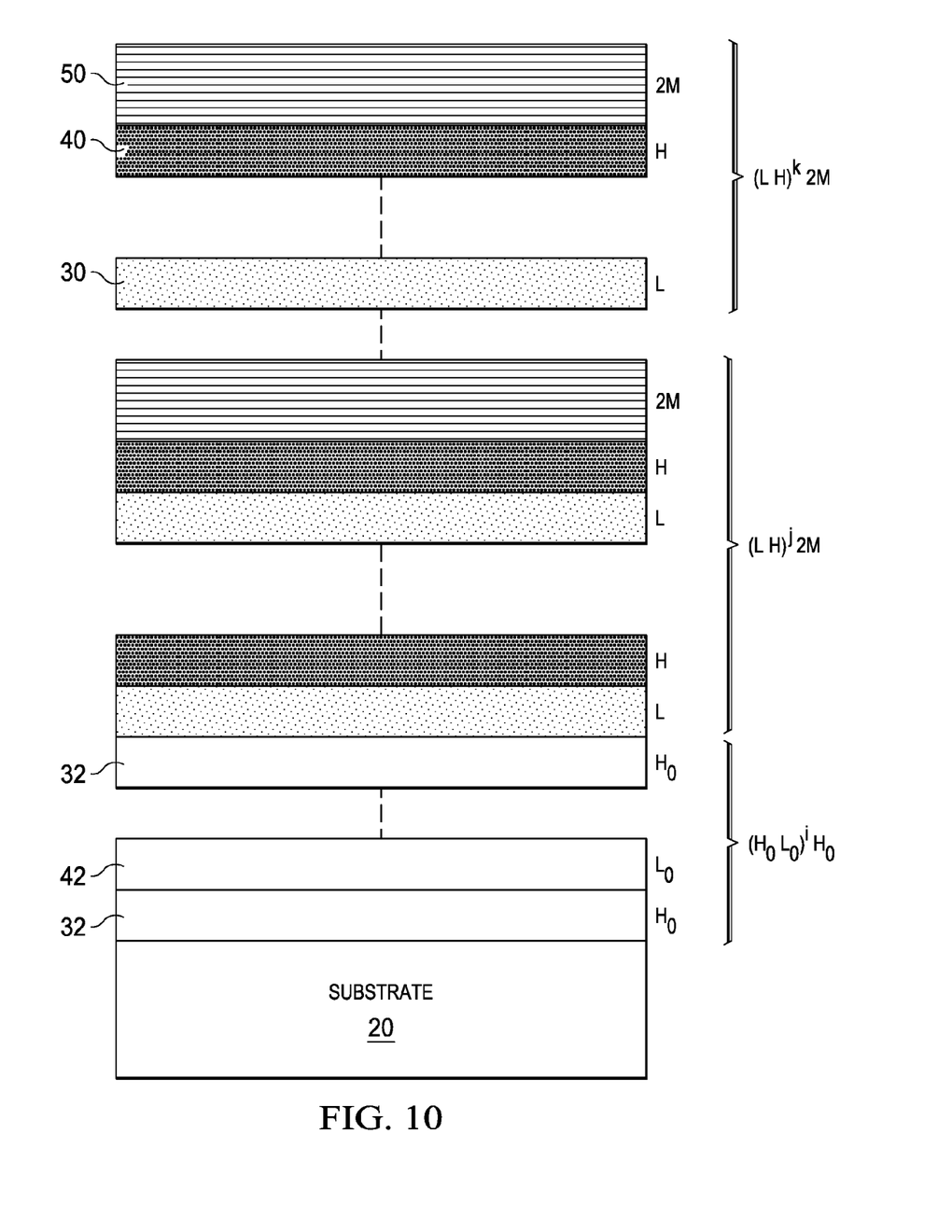
FIG. 10 is a schematic diagram illustrating the surface and interface of an engineered fluoride-enhanced-oxide mirror.

The invention, in another embodiment, is also directed to fluoride-enhanced-oxide mirrors in which the fluoride enhanced stacks are smoothed by inserting PIAD deposited $SiO_2$ layers in a Formula (4)

$$\text{Sub\_}H_0(L_0H_0)^i(LH)^j 2M \ldots (LH)^k 2M \quad (4)$$

or Formula (5)

$$\text{Sub\_}(H_0L_0)^i H(LH)^j 2M \ldots H(LH)^k 2M \quad (5)$$

where $H_0$ and $L_0$ corresponds to a quarter-wave high index $Al_2O_3$ and a quarter-wave low index $SiO_2$, respectively; 2M represents a half-wave $SiO_2$ layer; and H and L are high index and low index fluoride layers, respectively. A schematic of surface and interface engineered fluoride-enhanced-oxide mirror is shown in FIG. 10 where $H_0$ is numeral 32; $L_0$ is numeral 42; and H, L and 2M are represented by numerals as previously indicated.

[6]. Surface/Interface Engineered Fluoride-Enhanced-Aluminum Mirror

Figure 11:
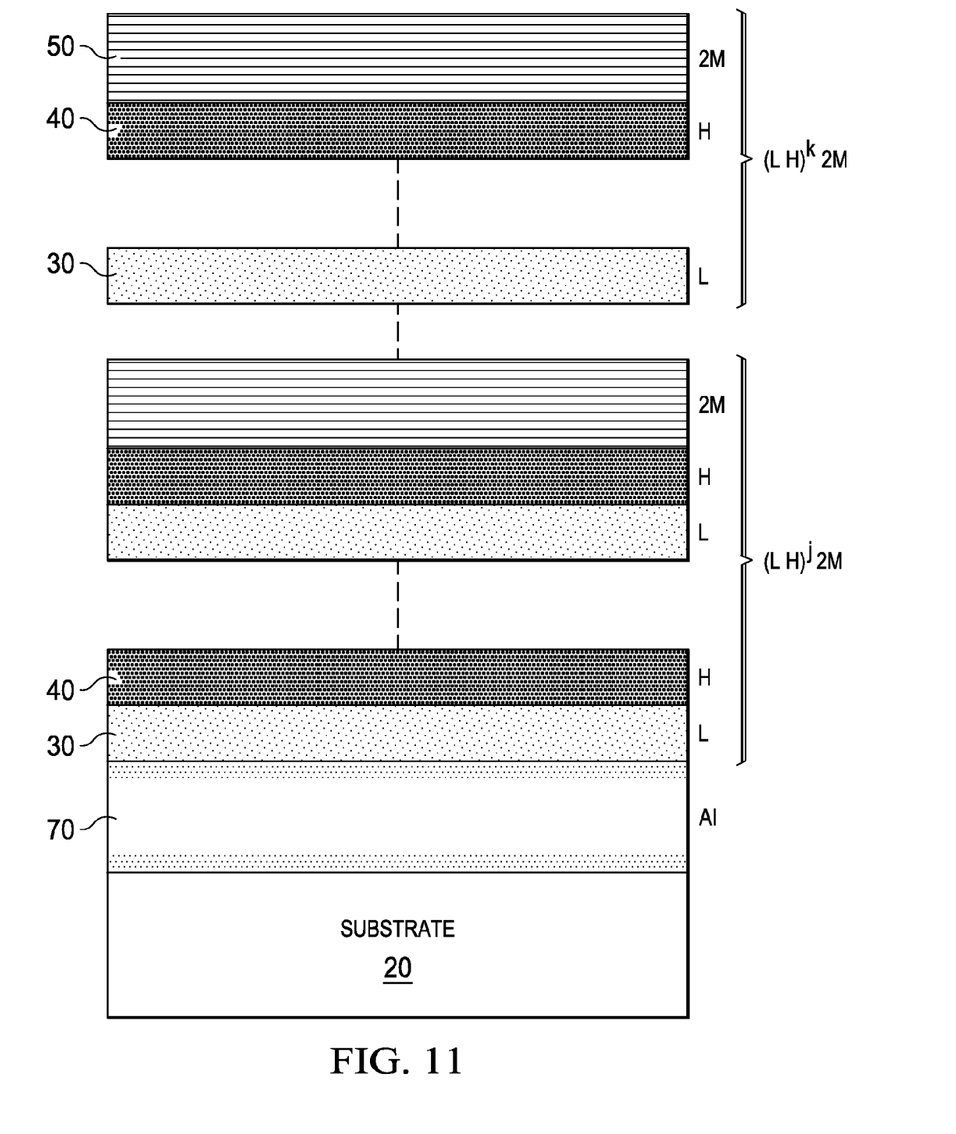
FIG. 11 is a schematic diagram illustrating the surface and interface engineered fluoride-enhanced-Al mirror.

The invention, in another embodiment, is also directed to fluoride-enhanced-aluminum mirror, in which the fluoride enhanced stacks are smoothed by inserting PIAD deposited $SiO_2$ layers as represented by Formula (6):

$$\text{Sub\_}A(LH)^j 2M \ldots (LH)^k 2M \quad (6)$$

or Formula (7)

$$\text{Sub\_}AH(LH)^j 2M \ldots (LH)^k 2M \quad (7)$$

where A is a thickness aluminum (Al) layer; 2M represents a half-wave $SiO_2$ layer; and H and L are high index and low index fluoride layers, respectively. A schematic of surface and interface engineered fluoride-enhanced-Al mirror is shown in FIG. 11, the aluminum layer (Al) being represented by numeral 70; and H, L and 2M are represented by numerals as previously indicated.

To summarize the characteristics of the invention:

H can be any high refractive index fluoride material, for example, $GdF_3$, $LaF_3$, and other high refractive index metal fluoride materials known in the art.

L can be any low refractive index fluoride material, for example, $AlF_3$, $MgF_2$, $CaF_2$ and other low refractive metal fluoride materials known in the art $SiO_2$ based layer can be $SiO_2$ or modified $SiO_2$, for example, F-doped $SiO_2$, N-doped $SiO_2$, and $Al_2O_3$-doped $SiO_2$.

Energetic smoothing technique that can be used in practicing the invention can be PIAD (plasma ion-assisted deposition), IAD (ion assisted deposition), IBS (ion beam sputtering), and similar energetic techniques known in the art as being useful for the deposition of the oxide materials and particularly oxide materials.

The layer order of H and L in Formulas (3)-(7) can be changed. For example, the order in Formula (3) may change from $$\text{Sub\_}H(LH)^i 2M(LH)^j 2M \ldots (LH)^k 2M \quad (3)$$

to $$\text{Sub\_}(HL)^i 2MH(LH)^j 2M \ldots (LH)^k 2M \quad (8)$$

or $$\text{Sub\_}(LH)^i 2M(LH)^j 2M \ldots (LH)^k 2M \quad (9)$$

Formulas 4-7 may similarly be changed.

Changing the optical thickness in Formulas (3)-(7) enables one to apply the invention to S-polarization or P-polarization mirrors at high angle of incidence at 193 nm. Typically the thickness of the high refractive index layer is in the range of 20 to 35 nm, and the thickness of the low refractive index material is in the range of 30 to 45 nm. The thickness of the $SiO_2$ film inserted, in accordance with the invention, after a period or a stack of periods is typically in the range of 5 to 75 nm. The thickness can be changed to 22 to 39 nm for the high refractive index material and 36 to 54 nm for the low refractive index material for applications to S-polarization or P-polarization mirrors at high angle of incidence at 193 nm.

The element can be selected from the group consisting of reflective mirrors, beamsplitters, prisms, lenses, and output couplers.

The high refractive index material can be selected from the group consisting of $GdF_3$ and $LaF_3$.

The low refractive index material can be selected from the group consisting of $MgF_2$, $CaF_2$ and $AlF_3$.

The thickness of the amorphous $SiO_2$ layer inserted between the periods of high and low refractive index materials can be in the range of 5 nm to 75 nm.

Changing optical thickness in Equations (3)-(7) also enables one to apply the invention to other DUV laser wavelengths, for example, other <200 nm laser systems that operate at such <200 nm wavelengths such as 157 nm, 198.5 nm.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. An element for use in wavelengths less than 200 nm laser systems, said element comprising:
   a substrate,
   a plurality of periods of fluoride coating materials, each of said periods comprising at least one layer of a high refractive index fluoride material and at least one layer of a low refractive fluoride material, a plurality of layers of an amorphous SiO$_2$ based material selected from the group consisting of amorphous silica, amorphous F-doped SiO$_2$, amorphous N-doped SiO$_2$ and amorphous Al$_2$O$_3$-doped SiO$_2$, wherein one of said layers of amorphous SiO$_2$ is inserted between periods of said fluoride coating materials or between a stack of a plurality said periods, wherein said high refractive index fluoride material has an index in the range of 1.65 to 1.75 and said low refractive fluoride material has an index in the range of 1.35 to 1.45, and wherein the thickness of the amorphous SiO$_2$ layer inserted between the periods of high and low refractive index materials is in the range of 5 nm to 75 nm.

2. The element according to claim 1, wherein a last coating material applied to said element is a layer of an amorphous SiO$_2$ material selected from the group consisting of amorphous silica, amorphous F-doped SiO$_2$, amorphous N-doped SiO$_2$ and amorphous Al$_2$O$_3$-doped SiO$_2$.

3. The element according to claim 2, wherein the last coating material applied to said element is the layer of the SiO$_2$ material having a thickness in the range of 10 nm to 150 nm.

4. The element according to claim 1, wherein the thickness of each period of fluoride coating material is in the range of 50 nm to 90 nm.

5. The element according to claim 1, wherein the thickness of the high refractive index layer within each period of fluoride coating material is in the range of 20 nm to 40 nm.

6. The element according to claim 1, wherein the thickness of the low refractive index layer within each period of fluoride coating material is in the range of 30 nm to 50 nm.

7. The element according to claim 1, wherein said element is selected from the group consisting of reflective mirrors, beamsplitters, prisms, lenses, and output couplers.

8. The element according to claim 1, wherein the element is a reflective mirror.

9. The element according to claim 1, wherein the high refractive index material is selected from the group consisting of GdF$_3$ and LaF$_3$.

10. The element according to claim 1, wherein the low refractive index material is selected from the group consisting of MgF$_2$, CaF$_2$ and AlF$_3$.

11. The element according to claim 1, further comprising a coating of an amorphous SiO$_2$ material between the substrate and the first period of the fluoride coating materials.

12. The element according to claim 11, wherein the thickness of the amorphous SiO$_2$ layer applied between the substrate and the first period is in the range of 5 nm to 75 nm.

13. The element according to claim 11, wherein the coating of the amorphous SiO$_2$ material between the substrate and the first period of the fluoride coating materials further comprises at least a quarter-wave high index Al$_2$O$_3$ layer and a quarter-wave low index SiO$_2$ layer.

14. The element according to claim 1, further comprising a coating of aluminum between the substrate and the first period of the fluoride coating materials.

15. The element according to claim 1, wherein the element has a structure based on following formula:

$$\text{Sub\_H(LH)}^i 2M(LH)^j 2M \ldots (LH)^k 2M$$

where Sub represents the substrate, where 2M represents a half-wave amorphous SiO$_2$ layer, where H and L represent the high refractive index fluoride material and the low refractive index fluoride material layers, respectively, and i, j . . . and k represent the stack periods.

16. The element according to claim 1, wherein the element has a structure based on following formula:

$$\text{Sub\_H}_0(\text{L}_0\text{H}_0)^i(LH)^j 2M \ldots (LH)^k 2M$$

where Sub represents the substrate, where 2M represents a half-wave amorphous SiO$_2$ layer, where H and L represent the high refractive index fluoride material and the low refractive index fluoride material layers, respectively, where H$_0$ and L$_0$ corresponds to a quarter-wave high index Al$_2$O$_3$ layer and a quarter-wave low index SiO$_2$ layer, and i, j . . . and k represent the stack periods.

17. The element according to claim 1, wherein the element has a structure based on following formula:

$$\text{Sub\_(H}_0\text{L}_0)^i\text{H(LH)}^j 2M \ldots \text{H(LH)}^k 2M$$

where Sub represents the substrate, where 2M represents a half-wave amorphous SiO$_2$ layer, where H and L represent the high refractive index fluoride material and the low refractive index fluoride material layers, respectively, where H$_0$ and L$_0$ corresponds to a quarter-wave high index Al$_2$O$_3$ layer and a quarter-wave low index SiO$_2$ layer, and i, j . . . and k represent the stack periods.

18. The element according to claim 1, wherein the element has a structure based on following formula:

$$\text{Sub\_A(LH)}^j 2M \ldots (LH)^k 2M$$

where Sub represents the substrate, where A represents an aluminum layer, where 2M represents a half-wave amorphous SiO$_2$ layer, where H and L represent the high refractive index fluoride material and the low refractive index fluoride material layers, respectively, and i, j . . . and k represent the stack periods.

19. The element according to claim 1, wherein the element has a structure based on following formula:

$$\text{Sub\_AH(LH)}^j 2M \ldots (LH)^k 2M$$

where Sub represents the substrate, where A represents an aluminum layer, where 2M represents a half-wave amorphous SiO$_2$ layer, where H and L represent the high refractive index fluoride material and the low refractive index fluoride material layers, respectively, and i, j . . . and k represent the stack periods.

20. The element according to claim 1, wherein the element has a structure based on following formula:

$$\text{Sub\_(HL)}^i 2M \, H(LH)^j 2M \ldots (LH)^k 2M$$

where Sub represents the substrate, where 2M represents a half-wave amorphous SiO$_2$ layer, where H and L represent the high refractive index fluoride material and the low refractive index fluoride material layers, respectively, and i, j . . . and k represent the stack periods.

21. The element according to claim 1, wherein the element has a structure based on following formula:

$$\text{Sub\_(LH)}^i 2M(LH)^j 2M \ldots (LH)^k 2M$$

where Sub represents the substrate, where 2M represents a half-wave amorphous SiO$_2$ layer, where H and L represent the high refractive index fluoride material and the low refractive index fluoride material layers, respectively, and i, j . . . and k represent the stack periods.

22. A reflective mirror element for use in wavelengths less than 200 nm laser systems, said element comprising:

a substrate, a plurality of periods of fluoride coating materials, each of said periods comprising at least one layer of a high refractive index fluoride material and at least one layer of a low refractive fluoride material, a plurality of layers of an amorphous $SiO_2$ based material selected from the group consisting of amorphous silica, amorphous F-doped $SiO_2$, amorphous N-doped $SiO_2$ and amorphous $Al_2O_3$-doped $SiO_2$, wherein one of said layers of amorphous $SiO_2$ is inserted between periods of said fluoride coating materials or between a stack of a plurality of said periods, and wherein the thickness of the amorphous $SiO_2$ material between the periods is in the range of 5 nm to 75 nm.

23. The reflective mirror element according to claim 22, wherein a last coating material on said mirror element is a layer of an amorphous $SiO_2$ material, said layer having a thickness in the range of 10 nm to 150 nm.

* * * * *